United States Patent [19]

Germer

[11] Patent Number: 4,627,000

[45] Date of Patent: Dec. 2, 1986

[54] APPARATUS AND METHOD FOR COPYING DATA FROM ONE ELECTRONIC DEMAND REGISTER TO ANOTHER

[75] Inventor: Warren R. Germer, Dover, N.H.

[73] Assignee: General Electric Company, Somersworth, N.H.

[21] Appl. No.: 599,685

[22] Filed: Apr. 12, 1984

[51] Int. Cl.[4] ...................... G01R 11/64; G06F 11/00; G06F 15/46

[52] U.S. Cl. ................................ 364/483; 324/103 R; 324/116

[58] Field of Search ............................... 364/480–484, 364/492, 493, 900 MS File; 324/103 R, 116

[56] References Cited

U.S. PATENT DOCUMENTS

| | | | |
|---|---|---|---|
| 4,361,877 | 11/1982 | Dyer et al. | 364/900 |
| 4,395,763 | 7/1983 | Takahashi | 364/900 |
| 4,415,853 | 11/1983 | Fisher | 324/103 R X |
| 4,509,128 | 4/1985 | Coppola et al. | 364/483 |
| 4,516,213 | 5/1985 | Gidden | 364/483 |

Primary Examiner—Felix D. Gruber
Assistant Examiner—H. R. Herndon
Attorney, Agent, or Firm—R. E. Brunson; T. R. Morrison

[57] ABSTRACT

A non-volatile memory copy programmer provides temporary storage into which data can be read out from a non-volatile memory of an electronic demand register of an electric meter and from which the stored data can be written into a non-volatile memory in a replacement demand register. The non-volatile memory copy programmer also produces control signals for controlling reading and writing in the non-volatile memory. A power monitor circuit in the demand register enables the storage of data from a volatile memory to the non-volatile memory in the event of a loss of power and enables restoring the data from the non-volatile to the volatile memory when the power is restored. The power monitor circuit recognizes a power loss resulting from the removal of the demand register from the electric meter in the same manner as it recognizes a normal power loss so that, when the demand register is removed for service or troubleshooting, the installation-specific data and the billing data contained in the volatile memory are safely transferred to the non-volatile memory. If replacement of the demand register is required, the non-volatile memory copy programmer enables the copying of the data from the non-volatile memory in the removed demand register to a non-volatile memory in a replacement demand register.

3 Claims, 5 Drawing Figures 4,627,000

APPARATUS AND METHOD FOR COPYING DATA FROM ONE ELECTRONIC DEMAND REGISTER TO ANOTHER

BACKGROUND OF THE INVENTION

The present invention relates to electric meters and, more particularly, to electronic demand registers of the type having volatile and non-volatile memories, the non-volatile memories being used for storing installation-specific and billing data during periods when the integrity of such data may be in danger.

Conventional electric meters employ an aluminum disk driven as a rotor of a small induction motor by an electric field at a speed which is proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain means for separating the consumption into those parts of consumption occurring during peak and off-peak hours (however defined) and for recording maximum demand during a predetermined period of time in order to adjust billing according to such parameters. In one such demand meter disclosed in U.S. Pat. No. 3,586,974, a mechanical demand register records the power usage during a predetermined period of time and stores the value for reading. The predetermined period of time may be, for example, the time between meter readings, or a period of time corresponding to the billing period of the utility providing the power. A clockwork mechanism restarts the demand register at the ends of regular demand intervals of, for example, a fraction of an hour, so that, at the end of the predetermined period, the stored value represents the highest value of power usage occurring during any one of the regular demand intervals in the predetermined period.

Demand registers of the mechanical type, such as disclosed in the above U.S. patent, have limited flexibility. Once their design is completed for a particular meter physical configuration, the design is not transferrable to a meter having a different physical configuration. In addition, the demand-measurement functions cannot be redefined without major mechanical redesign.

Greater flexibility may be obtainable using electronic acquisition, integration and processing of power usage. An electronic processor such as, for example, a microprocessor may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the power usage during defined periods of time.

An electronic processor of an electronic demand register conventionally employs volatile random access memory for the high speed and low power consumption characteristics offered by such devices. However, electronic devices occasionally fail and require troubleshooting and repair or replacement of defective parts. One convenient troubleshooting method employs the substitution of a replaceable module for a module which may be defective. Such a troubleshooting method is foreseen for use with the system of the present invention. Such a troubleshooting method raises the problem of defining a practical way of copying the unique set of programmed constants and billing data from a non-volatile memory in a demand register being replaced into a non-volatile memory of a replacement demand register.

OBJECTS AND SUMMARY OF THE INVENTION

Accordingly, it is an object of the invention to provide an electronic demand register which overcomes the drawbacks of the prior art.

It is a further object of the invention to provide an electronic demand register of the type employing a digital processor and a random access memory which includes means for storing volatile data in a non-volatile storage medium upon the occurrence of a predetermined deviation from normal power conditions and which further includes means for copying installation-specific and billing data from a demand register being removed from an electric meter to a replacement demand register being installed in the electric meter.

Briefly stated, the present invention provides a non-volatile memory copy programmer which includes apparatus for temporary storage into which data can be read out from a non-volatile memory of an electronic demand register of an electric meter. The temporarily stored data can then be written into a replacement non-volatile memory. The non-volatile memory copy programmer also provides control signals for controlling reading and writing in the non-volatile memory. A power monitor circuit in the demand register normally enables the storage of data from a volatile memory to the non-volatile memory in the event of a loss of power and enables restoring the data from the non-volatile to the volatile memory when the power is restored. The power monitor circuit recognizes loss of power resulting from the removal of the demand register from the electric meter in the same manner as it recognizes a normal power loss so that, when the demand register is removed for service or troubleshooting, the installation-specific data and the billing data are safely transferred to the non-volatile memory. If replacement of the demand register is required, the non-volatile memory copy programmer enables the copying of the data from the non-volatile memory in the removed demand register to a non-volatile memory in a replacement demand register.

According to an embodiment of the invention, there is provided apparatus for copying data from a first electronic demand register to a second electronic demand register, the first and second electronic demand registers each containing a processor having a volatile memory and a non-volatile memory comprising means responsive to a loss of power in the demand register for writing the data from the volatile memory to the non-volatile memory, a non-volatile memory copy programmer, first means in the non-volatile memory copy programmer for temporarily storing the data read out of the non-volatile memory in the first electronic demand register, second means in the non-volatile memory programmer for writing temporarily stored data from the first means for temporarily storing into the non-volatile memory in the second electronic demand register, the second means including means for producing control signals for controlling at least a read and a write operation of the non-volatile memory in the first electronic demand register and the non-volatile memory in the second electronic demand register and means in the non-volatile memory copy programmer for holding the one of the first and second demand registers being read from and written to in a reset condition while the data is being read from and written to the non-volatile memory.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be adapted to any suitable style of electric meter which employs an element rotating at a speed proportional to power consumption, including single phase meters with one or more current windings and polyphase meters, for concreteness, the detailed description which follows is directed toward an illustrative example of a 2-wire single phase meter of the type having a single current coil and a single voltage coil.

Figure 1:
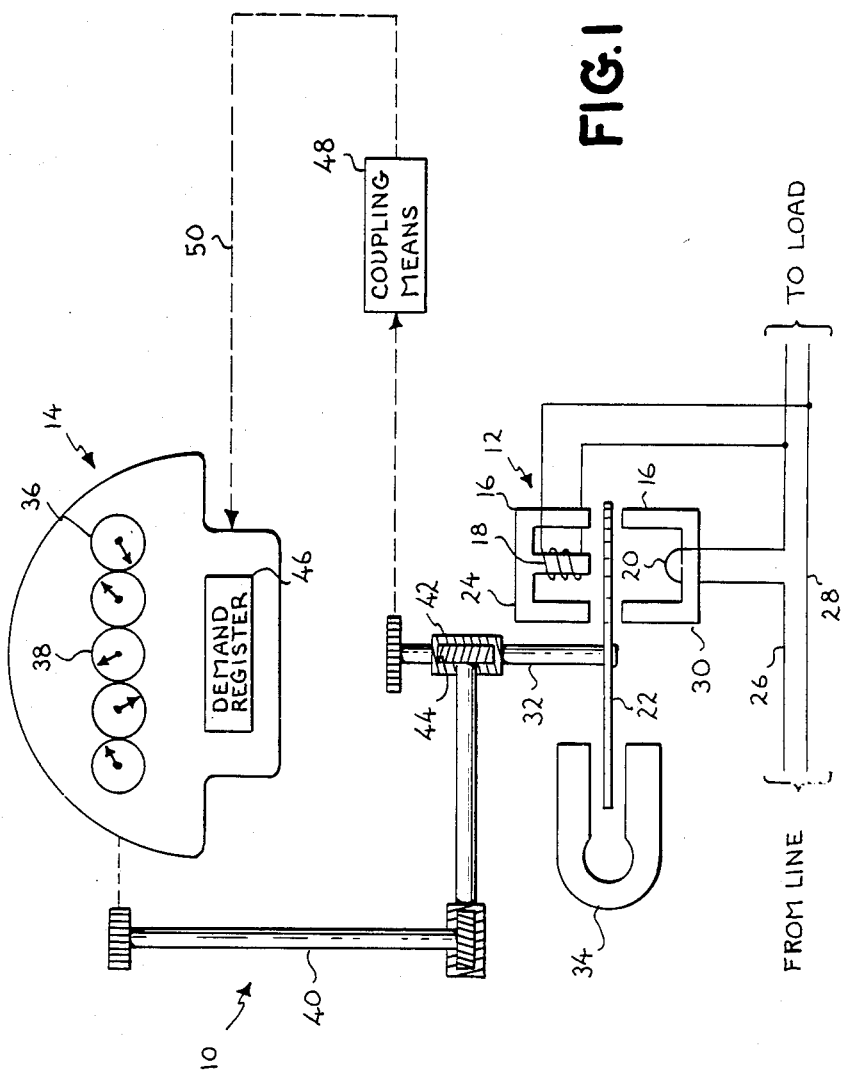
FIG. 1 is a schematic diagram of an electric meter to which the present invention may be applied.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically one or two, of heavy conductor are wound. Current coil 20 is connected in series with the power being fed to the load on line 26.

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20 combined with the retarding torque produced by permanent magnet 34 is effective to rotate disk 22 at a speed which is proportional to the product of the voltage and the current; that is, the power, consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, which engages and rotates a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46, shown schematically as a box in FIG. 1, is also connected by a suitable coupling means 48 to respond to the rotation of shaft 32. In the prior art, demand register 46 is conventionally a mechanical register having dials, or other indicating devices (not shown), and coupling means 48 is conventionally a mechanical arrangement including shafts and gearing driven by rotation of shaft 32. The dials, or indicating devices, in the mechanical embodiment of demand register 46 are urged forward for a fixed period of time by a pusher mechanism (not shown). The pusher mechanism is reset and restarted at the end of each of the fixed periods of time, leaving the indicating devices with an indication proportional to the power usage (the demand) during the fixed period of time. The indication on the indicating devices at any time is, therefore, the highest demand which has occurred during any of the time periods since the last time the indicating devices were reset. The recorded demand is employed in billing. In the present invention, demand register 46 is an electronic demand register.

Figure 2:
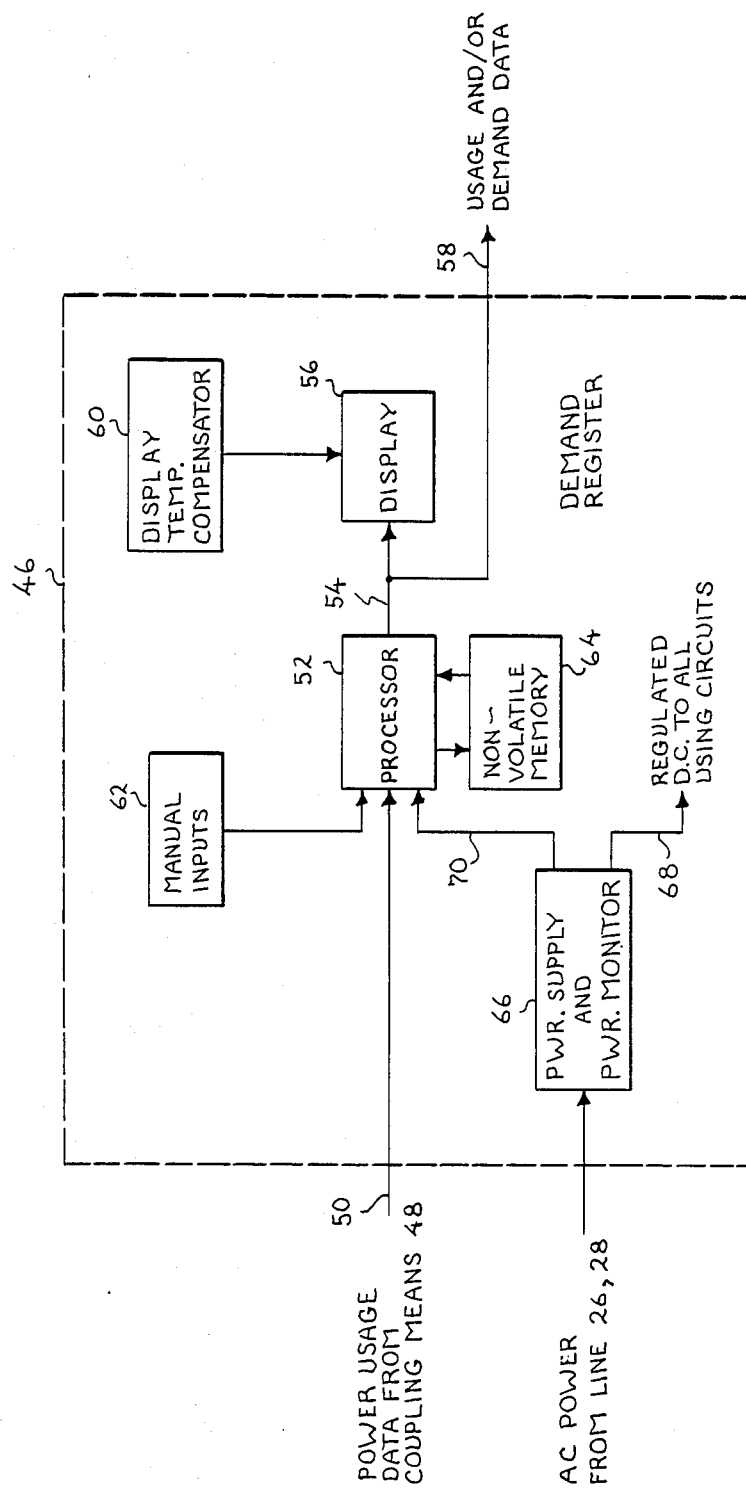
FIG. 2 is a block diagram of a demand register of FIG. 1 according to an embodiment of the invention.

Referring now to FIG. 2, there is shown, a simplified block diagram of a demand register 46 according to an embodiment of the invention. For present purposes, it is sufficient to note that the signal related to power usage fed from coupling means 48 to demand register 46 is an electronic signal having a characteristic such as, for example, a frequency, which is variable in dependence on the rate of power usage. Any suitable electronic signal generating apparatus, such as disclosed in the referenced prior patents, may be employed to produce a power usage signal which is applied on a line 50 to a processor 52 in demand register 46. Processor 52 appropriately performs calculations on the usage data to derive desired demand parameters and stores the result. In addition, processor 52 may provide an output on a line 54 suitable for driving a display 56. In addition, the stored data may be transmitted on a line 58 to a remote location (not shown) for further analysis and/or billing.

Due to the extremes of environment in which electric meters may be used, display 56 may need special compensation for environmental parameters. Such special compensation may include a display temperature compensator 60 whose detailed structure and function are not of interest to the present disclosure.

The data which processor 52 transmits for display and/or the manner in which processor 52 operates on the input data to produce internally stored values may be modified according to a manual input 62 which is not of concern to the present disclosure.

As previously noted, processor 52 conventionally employs volatile random access memory elements which lose any data stored in them in the event of a power outage. This is usually not acceptable in an electric meter where such loss of usage and/or demand data has a negative financial impact on the utility supplying the electric power. Non-volatile storage elements such as, for example, electrically erasable programmable read only memory elements, are well known for use with processor 52. However, such non-volatile storage elements normally have relatively slow erase and write times on the order of 10 or 20 milliseconds. This is too slow for most applications. In addition to this drawback, the power required to write such memory elements is quite high compared to that required by volatile memory elements of processor 52. Finally, a wear-out mechanism in electrically erasable programmable read only memory cells limits the number of times they can be erased and re-recorded. About 10,000 cycles of write and erase brings such a memory element to the end of its reliable useful life. Memory elements in processor 52 must, of course, be written and erased many thousands of times a day. Thus, an electrically erasable programmable read only memory would have a very short life as the operating memory for processor 52. In its role in non-volatile memory 64, however, electrically erasable programmable read only memory elements are erased and rewritten only when a relatively serious power outage occurs and possibly during a relatively small number of test cycles. Such operations are not expected to occur on a frequent enough basis in the register of an electric meter to represent a limit on the life of the register.

In order to provide safe storage for data and/or programmed constants during a power outage, a conventional non-volatile memory 64 is provided into which such data and constants can be written in the event of a power outage and from which the data and constants can be again read upon restoration of normal conditions.

A power supply and power monitor 66 receives AC power from lines 26 and 28 for the production of a regulated DC voltage which is applied on a line 68 to all circuits in demand register 46 requiring such power. In addition to producing regulated DC power, power supply and power monitor 66 also monitors the condition of the AC power on lines 26 and 28 and, in response to certain detected conditions, applies control signals on a line 70 to processor 52 which controls the transfer of data from processor 52 to non-volatile memory 64 in the event of an apparent power outage and resets processor 52 in the event of an actual power outage.

In summary, when a momentary power outage on lines 26 and 28 causes the voltage of the unregulated DC voltage to fall below a first threshold value, a timer is started. If the unregulated DC voltage does not rise above a second threshold, slightly higher than the first threshold before the timer times out, processor 52 is commanded to transfer billing data and programmed constants to non-volatile memory 64. A capacitor in power supply and power monitor 66 stores sufficient energy to maintain operation of demand register 46 for the duration of the timer delay, and to then have sufficient energy remaining therein to write the billing data and programmed constants to non-volatile memory 64.

The length of the timing cycle in power supply and power monitor 66 is established at a value which is long enough to ensure that a reduction in the supply voltage probably results from a serious power outage rather than from surges, noise or a purely momentary power outage.

When demand register 46 is removed from electric meter 10, or when electric meter 10 is removed from connection to line 26 and line 28, power supply and power monitor 66 recognizes the loss of supply voltage as an impending power outage and executes the process of writing the data from volatile memory in processor 52 to non-volatile memory in non-volatile memory 64. Thus, the installation-specific data which is contained in the programmed constants and the billing data are stored in non-volatile memory 64 and may be made available for writing to a non-volatile memory 64 in a replacement demand register 46 if provision is made of a suitable memory programmer which permits copying of such data from the previous non-volatile memory 64 to the replacement non-volatile memory 64. A full disclosure of the apparatus and function of power supply and power monitor 66 is contained in U.S. patent application 599,736, now U.S. Pat. No. 4,591,782, filed on the same date as the present application and the disclosure of which is hereby incorporated by reference.

Figure 3:
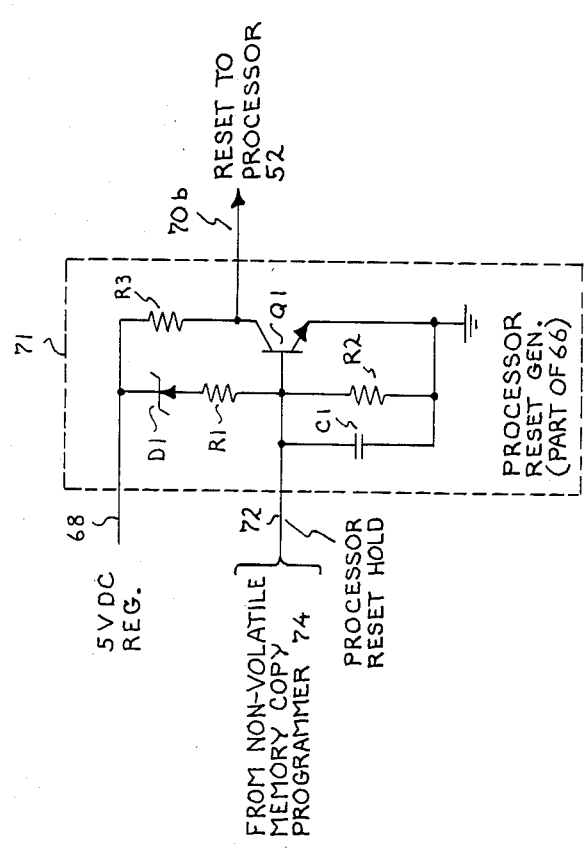
FIG. 3 is a schematic diagram of a processor reset generator of the power supply and power monitor of FIG. 2.

Referring now to FIG. 3, there is shown a processor reset generator 71 which is an element of power supply and power monitor 66 having particular relevance to the present invention. It is the function of processor reset generator 71 during normal operation to monitor the regulated DC voltage on line 68 and to apply a reset signal to processor 52 whenever the regulated DC voltage falls below a predetermined value that is no longer high enough to maintain the regulated DC voltage at about its operating value. It is also convenient for processor reset generator 71 to produce a reset signal for processor 52 during normal power-up as the regulated DC voltage rises from zero to its normal value.

Processor reset generator 71 contains a switching transistor Q1 whose base is connected to the regulated DC supply through a zener diode D1 in series with a resistor R1. A second resistor R2 is connected between the base of switching transistor Q1 and ground. In the preferred embodiment, zener diode D1 has a breakdown zener voltage of about 2.7 volts and resistors R1 and R2 have equal resistance values.

Figure 4:
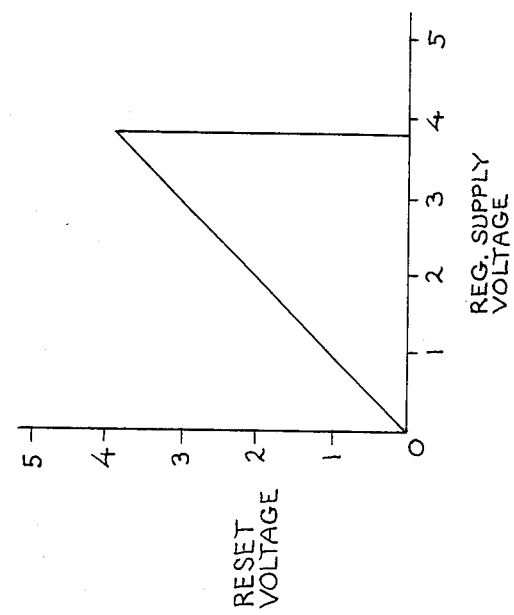
FIG. 4 is a graph showing the reset voltage versus the regulated supply voltage of the power supply and power monitor of FIG. 3.

In operation, when the regulated DC supply voltage is below a threshold value, switching transistor Q1 is cut off and the reset signal on line 70b follows the regulated DC supply voltage. At and above the threshold voltage, switching transistor Q1 is turned on and thus holds line 70b low. This relationship is illustrated in FIG. 4. When the regulated DC supply voltage decreases from its nominal value of 5 volts to a threshold value of about 3.9 volts the voltage on line 70b jumps from about zero to about 3.9 volts and follows the supply voltage as it decreases. The reset signal as shown in FIG. 4 therefore provides a reset signal both when the regulated DC supply voltage decays below the threshold as well as when the regulated DC supply voltage comes up following a power outage or during a normal turn-on. A processor reset hold signal line 72 is maintained in a floating condition during normal operation but may be grounded for purposes to be described when demand register 46 is removed from electric meter 10.

Figure 5:
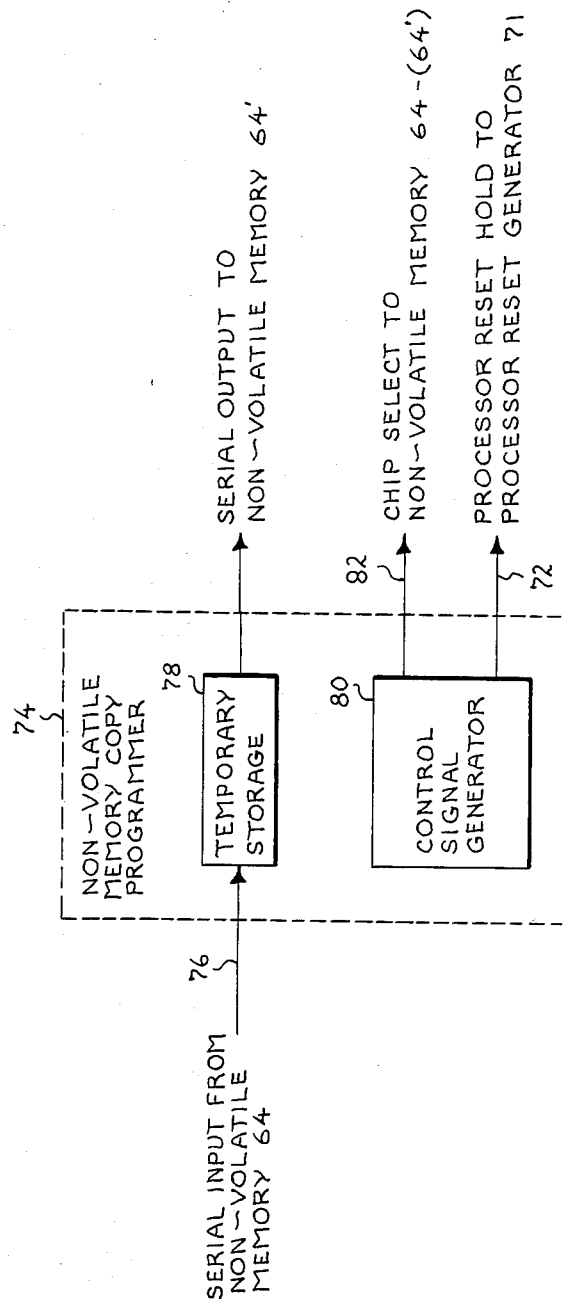
FIG. 5 is a simplified block diagram of a non-volatile memory copy programmer according to an embodiment of the invention.

Referring now to FIG. 5, a non-volatile memory copy programmer 74 is capable of being connected to a removed demand register 46 to receive serial input read from non-volatile memory 64 on a line 76. The serial input is temporarily stored in a temporary storage 78.

The data temporarily stored in temporary storage 78 may be copied into a replacement non-volatile memory 64'. In order to enable the above reading and copying operations, a control signal generator 80 is provided to apply an appropriate chip select signal on a line 82 to non-volatile memory 64 or a replacement non-volatile memory 64'. While reading or copying data, control signal generator 80 is effective to place a ground on processor reset generator 71. This holds the base of transistor Q1 (FIG. 3) at ground potential and maintains processor 52 in the reset condition.

Control signal generator 80 may employ any convenient devices to produce the appropriate logic level signals for controlling non-volatile memory 64 (or a replacement non-volatile memory 64') such as, for example, mechanically or electrically controlled switches. Temporary storage 78 may also be any convenient apparatus for formatting an appropriate output message and for decoding an input message prior to storage. Temporary storage 78 may include, for example, a microprocessor with appropriate communications buffers. For example, non-volatile memory 64 may be a type NMC9306 non-volatile memory and processor 52 may be a type NEC 7503 microprocessor, both of which are commercially available at the time of filing of the present application. This is the same combination of equipment disclosed in U.S. patent application Ser. No. 599,683, now U.S. Pat. No. 4,573,141 filed on the same date as the present application, the disclosure of which is herein incorporated by reference.

As noted in the above-referenced patent application, problems may be encountered in passing data back and forth between non-volatile memory 64 and the particular microprocessor employed in processor 52 because of differences in the data formats for the two communicating devices. The solution described in the referenced application, which may be employed in non-volatile memory copy programmer 74, includes providing a communications buffer in temporary storage 78 which is effective for formatting a data message for transmission to non-volatile memory 64 (or a replacement non-volatile memory 64') which fools non-volatile memory 64 into recognizing a portion of the data message having an acceptable protocol. Similarly, the communications buffer performs selective shift and ignore operations on data received from non-volatile memory 64 to convert the data protocol into one which a microprocessor in temporary storage 78 is capable of accepting.

After the data read out from non-volatile memory 64 into temporary storage in temporary storage 78 has been copied into a replacement non-volatile memory 64', the ground signal on processor reset hold signal line 72 may be removed. This permits processor reset generator 71 to generate a reset signal which, among other things, reads the copied contents of non-volatile memory 64 into processor 52 in order to enable testing of demand register 46. When demand register 46 is physically removed from non-volatile memory copy programmer 74 and power is thereby cut off from demand register 46, the apparent power outage is effective in the manner described to erase non-volatile memory 64 and store the data therein. When demand register 46 is installed in an electric meter, and the voltage applied thereto rises above a predetermined value, the stored content of non-volatile memory 64 is returned to processor 52.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for copying data from a first electronic demand register to a second electronic demand register, said first and second electronic demand registers each containing a processor having a volatile memory and a non-volatile memory comprising:
   means responsive to a loss of power in said demand register for writing said data from said volatile memory to said non-volatile memory;
   a non-volatile memory copy programmer;
   first means in said non-volatile memory copy programmer for temporarily storing said data read out of said non-volatile memory in said first electronic demand register;
   second means in said non-volatile memory programmer for writing temporarily stored data from said first means for temporarily storing into said non-volatile memory in said second electronic demand register;
   said second means including means for producing control signals for controlling at least a read and a write operation of said non-volatile memory in said first electronic demand register and said non-volatile memory in said second electronic demand register; and
   means in said non-volatile memory copy programmer for holding said processor in a one of said first and second demand register being read from and written to in a reset condition while said data is being read from and written to said non-volatile memory.

2. Apparatus for copying according to claim 1 wherein said means for temporarily storing includes a microprocessor.

3. Apparatus according to claim 2 wherein said microprocessor and said non-volatile memory have incompatible data protocols and said microprocessor includes a communications buffer, said microprocessor including means for formatting an output message in said communications buffer effective for transfer to said non-volatile memory in a form which said non-volatile memory is capable of accepting, and said communications buffer further including means for at least one of a shift and a selective ignoring of data effective to enable said microprocessor to accept a data message transmitted from said non-volatile memory to said communications buffer.

* * * * *